United States Patent
Holaday et al.

(10) Patent No.: US 7,466,724 B2
(45) Date of Patent: Dec. 16, 2008

(54) APPARATUS AND METHOD OF ANALYZING PACKETIZED DATA SPANNING OVER MULTIPLE CLOCK CYCLES

(75) Inventors: David A. Holaday, Cornelius, OR (US); Geoffrey D. Cheren, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 611 days.

(21) Appl. No.: 10/965,503

(22) Filed: Oct. 14, 2004

(65) Prior Publication Data
US 2006/0083268 A1   Apr. 20, 2006

(51) Int. Cl.
*H04J 3/06* (2006.01)

(52) U.S. Cl. .................. 370/518; 370/514; 370/520; 370/513; 713/502

(58) Field of Classification Search ............... 370/509, 370/514, 518; 714/25; 702/89
See application file for complete search history.

(56) References Cited

U.S. PATENT DOCUMENTS

| | | | | |
|---|---|---|---|---|
| 4,752,928 A | * | 6/1988 | Chapman et al. | 714/39 |
| 5,313,622 A | * | 5/1994 | Truchard et al. | 714/814 |
| 6,463,392 B1 | * | 10/2002 | Nygaard et al. | 702/89 |
| 6,850,852 B1 | * | 2/2005 | Ferguson et al. | 702/67 |
| 7,096,395 B2 | * | 8/2006 | Litt | 714/724 |
| 7,272,528 B2 | * | 9/2007 | Holaday et al. | 702/118 |
| 2003/0070125 A1 | * | 4/2003 | Holaday et al. | 714/712 |
| 2003/0177272 A1 | * | 9/2003 | Shimosakoda | 709/248 |

OTHER PUBLICATIONS

Agilent Technologies, Inc., Web Manual Data Information, "N4220B Packet Analysis Probe For PCI Express", pp. 1-8, Copyright Apr. 2004.

* cited by examiner

*Primary Examiner*—Ricky Ngo
*Assistant Examiner*—Dewanda Samuel
(74) *Attorney, Agent, or Firm*—Thomas F. Lenihan; Moser, Patterson & Sheridan, LLP (57) ABSTRACT

A method and apparatus for processing packetized data spanning multiple clock cycles includes at least one comparator, for comparing a present clock cycle count to a reference clock cycle count, wherein the reference clock cycle values may be anywhere within the packet and may be non-contiguous with other reference clock cycle values. At least one word recognizer, compares a presently clocked word to a reference word, and an output circuit provides an indication of a favorable word comparison that occurred in response to a favorable clock cycle count comparison.

20 Claims, 4 Drawing Sheets

APPARATUS AND METHOD OF ANALYZING PACKETIZED DATA SPANNING OVER MULTIPLE CLOCK CYCLES

BACKGROUND OF THE INVENTION

1. Field of the Invention

The present invention generally relates to analyzing packetized information and, more specifically, to analyzing packetized information spanning many clock cycles.

2. Description of the Related Art

Logic Analyzers are test and measurement instruments used, for example, to monitor bus traffic to facilitate development and testing of microprocessor systems. Logic analyzers allow inspection of patterns (i.e., particular arrangements of logic states) in logic signals, and may be configured to detect the occurrence of selected events.

Many modern communication buses (e.g., 3GIO, Hypertransport and the like) use a packet-based protocol in which each byte or word of a packet is conveyed over the bus in response to the occurrence of a clock signal. A packet may include only a few bytes, or may include thousands of bytes of data that may span many clock cycles.

Capturing desired data frequently hinges on being able to specify a sufficiently meaningful trigger condition. The desired trigger condition may comprise a simple or complex sequence of events. For example, when a person uses a logic analyzer to trace a serial bus, a trigger event may need to be established by looking at numerous bytes in a packet spanning multiple clock cycles.

Trigger events are identified by using word recognizers in conjunction with a trigger state machine. A trigger state machine is circuitry that looks at the results of the trigger resources (word recognizers and the like) and determines what action to take, such as trigger the logic analyzer, go to another trigger state and start looking for a different word among other actions. Typically, a trigger machine in a logic analyzer is used to determine when to trigger, as well as to determine what data to store.

Word recognizers are utilized to compare the incoming bytes to a predefined value or word. The incoming data is sent to the word recognizer at each clock cycle. However, since all of the information in a packet is not available within a single clock cycle, it takes most, if not all, of the word recognizers, and most of the trigger states, to define just a simple trigger event. Since the trigger machine has used most, if not all of its resources (word recognizers, trigger states, and the like) just to track an incoming packet, the trigger machine cannot perform other (additional) tasks such as, for example, "wait for packet A to occur and then trigger when packet B occurs".

The model NT4220A packet analysis probe for PCI Express, manufactured by Agilent Technologies Inc. of Palo Alto, Calif., identifies a start-of-packet, and then looks for matches to fields within the packet header and data payload of up to the first twenty four contiguous bytes. All of the initial contiguous (e.g., twenty four) bytes are compared at one time to a reference value. While useful, this solution is relatively inflexible because it only allows a user to compare the first 24 bytes. For example, if the header of the packet is large (e.g., about 24 bytes), this solution may not be able to perform desired compare matches in the data payload or tail of the packet, or portions thereof.

SUMMARY OF THE INVENTION

Various deficiencies of the prior art are addressed by the present invention of a method and apparatus for processing packetized data spanning multiple clock cycles by comparing clock cycle counts to reference clock cycle counts to identify intra-packet words for comparison to reference words and determine thereby if a desired pattern of words exists in the packet.

Specifically, an apparatus for processing packetized data spanning multiple clock cycles according to one embodiment of the invention comprises: a Counter for counting clock cycles, the counter having a range at least equal to the maximum number of bytes in the packet to be compared, at least one Count Comparator for comparing a present clock cycle count to a reference clock cycle count, wherein the reference clock cycle values may be at any location within the packet, wherein a reference clock cycle value may be non-contiguous with any other reference clock cycle value.

The subject invention enables the tracking of packet style data as well as the release of resources to enable thereby more complex triggering conditions to be specified for a trigger machine, illustratively of a logic analyzer. In particular, the invention provides a Pattern Matching circuit for providing an indication of a word Pattern Match occurring in user selected bytes in a packet having a length spanning a plurality of clock cycles, where the user-selected bytes may, or may not, be contiguous.

In one embodiment, a Pattern Matching circuit includes at least one comparator for comparing a present clock cycle count to a reference clock cycle count, wherein the reference clock cycles are associated with at least one of a non-initial position of the packetized data and a non-contiguous portion of the packetized data. At least one word recognizer, compares a presently clocked word to a reference word, and a multiplexer (MUX), provides indication of a favorable word comparison contemporaneous with a favorable clock cycle count comparison.

BRIEF DESCRIPTION OF THE DRAWINGS

To facilitate understanding, identical reference numerals have been used, when appropriate, to designate identical elements that are common to the figures.

DETAILED DESCRIPTION

The present invention will be primarily described within the context of a Pattern Match apparatus and method suitable for use in a logic analyzer. One skilled in the art will appreciate that the teachings and embodiments of the present invention may also be applicable to other signal test and monitoring equipment that utilize Pattern Matching circuitry to initiate a trigger event, such as digital storage oscilloscopes (DSOs) and the like.

In an embodiment of the invention discussed below with respect to FIG. 1, each of a plurality of word recognizers operates to identify a respective reference word in a multiple clock cycle packet within an input data stream. Each of the word recognizers is associated with a respective comparator, which enables the word recognizer in response to the occurrence of respective reference count (i.e., an offset from a start of packet word).

In an embodiment of the invention discussed below with respect to FIG. 2, a single word recognizer is associated with a plurality of comparators, each of which enables the word recognizer in response to the occurrence of its respective reference count. The reference word used by the word recognizer is adapted in accordance with the enabling comparator. In the embodiments of FIG. 1 and FIG. 2, multiple output signals indicate the status of a pattern match operation during the operation.

In an embodiment of the invention discussed below with respect to FIG. 3, each of a plurality of word recognizers is associated with a respective comparator, which enables its respective word recognizer in response to the occurrence of respective reference count. Control logic enables a single output signal indicative of a favorable comparison of each of the plurality of reference words in their respective offset count positions within a multiple clock cycle packet.

Figure 1:
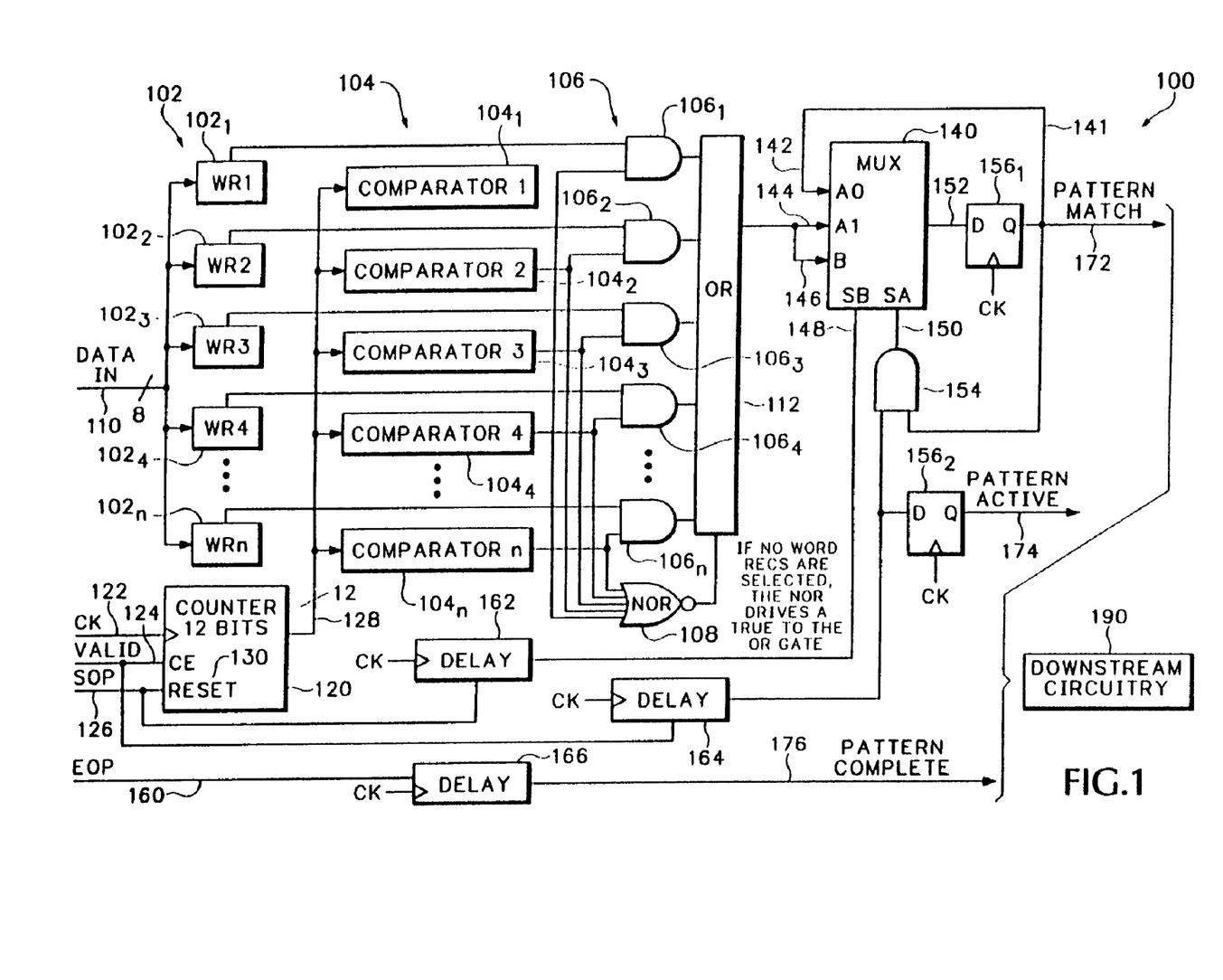
FIG. 1 depicts a schematic diagram of a Pattern Match circuit according to an embodiment of the present invention.
Figure 2:
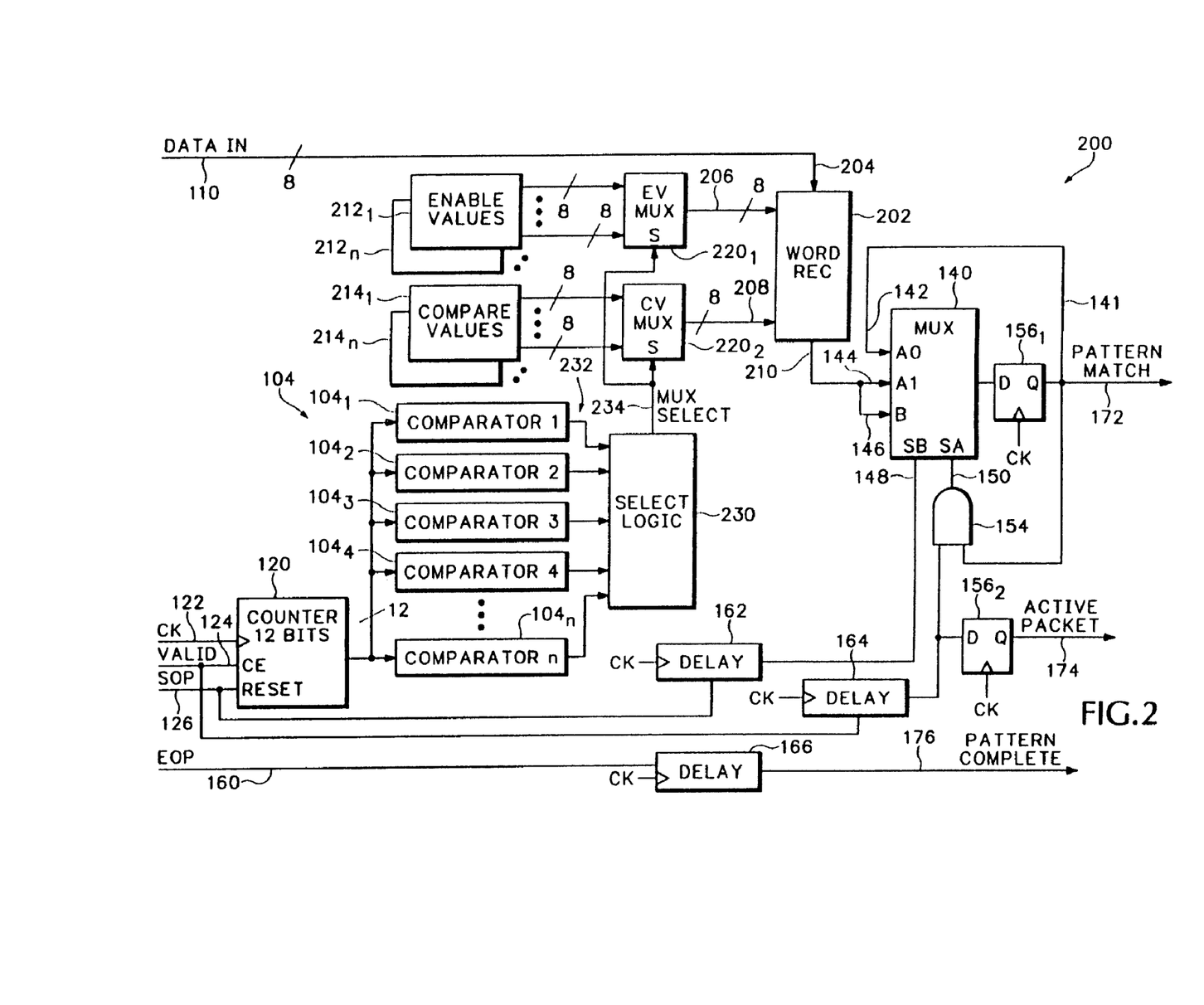
FIG. 2 is a schematic diagram of a Pattern Match circuit according to an embodiment of the present invention.

FIG. 1 depicts a schematic diagram of a Pattern Match circuit according to an embodiment of the present invention. The Pattern Match circuit 100 of FIG. 1 operates to identify desired patterns within a received data stream including packets spanning multiple clock cycles and responsively provides indicia of such identification.

The Pattern Match circuit 100 receives five input signals, namely, an input data stream DATA IN, a start-of-packet pattern signal SOP, a data valid signal VALID, an end of packet signal EOP and a system clock CK. The input data stream DATA IN comprises, illustratively, an 8-bit parallel data stream formed using serial data provided by, for example, a logic analyzer front end circuit. Any decoding or descrambling of the acquired data stream has been completed prior to processing by the Pattern Match circuit 100. While discussed in terms of an 8-bit parallel input data stream, it will be appreciated that the input data stream DATA IN may comprise more or fewer bits (e.g., 4-bit, 64-bit, 128-bit and the like) and, as such, the terms "byte" and "word" as used herein should be broadly interpreted to mean a selected data width. In the instant embodiment, the data width is defined by the number of parallel lines forming the data input signal DATA IN. The SOP signal comprises a pulse indicative of a first byte or word of a multiple clock cycle packet being presented to the Pattern Match circuit. The data valid signal indicates that the present clock cycle coincides with valid data in the multiple clock cycle packet. It is noted that there may be clock cycles within which there is no data to be evaluated, or that such data that is present belongs to a different packet. The EOP signal comprises a pulse indicative of a last byte or word of the multiple clock cycle packet being presented to the Pattern Match circuit. The clock signal CK is a system clock used to synchronize the various elements within the Pattern Match circuit, and associated circuitry within, e.g., a test and measurement device.

The Pattern Match circuit 100 produces three output signals; namely, PATTERN MATCH, PATTERN ACTIVE and PATTERN COMPLETE. The PATTERN MATCH signal indicates that incoming data matches a predefined pattern. In each embodiment of the invention, the PATTERN MATCH signal is immediately asserted as logically false if the incoming data fails to match the predefined pattern at any time during a comparison operation. The PATTERN ACTIVE signal indicates that the PATTERN MATCH output signal as of the present clock cycle represents a valid result of a pattern comparison as determined thus far. The PATTERN COMPLETE signal is a delayed end of packet signal, which indicates that the end of the multiple clock cycle packet being examined has been reached. The PATTERN COMPLETE signal indicates that the present clock cycle PATTERN MATCH output indicates the final results of the comparison. As will be discussed below with respect to the various figures, more or fewer input and output signals may be used without deviating from the teachings of the present invention. These signals are adapted for use by downstream circuitry to immediately communicate a pattern mismatch without waiting for an entire packet to be evaluated.

Pattern Match circuit 100 comprises a counter 120, a plurality of word recognizers $102_1$ through $102_n$ (collectively, word recognizers 102), a plurality of comparators $104_1$ through $104_n$ (collectively, comparators 104), a plurality of AND gates $106_1$ through $106_n$ (collectively, AND gates 106), an OR gate 112, a NOR gate 108, a multiplexer (MUX) 140, a plurality of flip-flops $156_1$ and $156_2$ (collectively, flip-flops 156), and a plurality of delay elements 162, 164, 166.

Each of the word recognizers 102 produces an output signal indicative of whether the word presently received via the input data stream DATA IN (110) matches a respective reference word. The output signal of each of the word recognizers 102 is coupled to a first input of a respective AND gate 106.

Each of the comparators 104 produces an output signal indicative of whether a count presently received from the counter 120 (via counter output signal 128) matches a respective reference count. The reference count represents the location of a byte or word that is offset in time within a multiple clock cycle packet being examined. The output signal of each of the comparators 104 is coupled to a second input of a respective AND gate 106. Each AND gate 106 provides an output signal indicative of whether a corresponding reference word is present at a corresponding offset position within the multiple clock cycle data packet.

The output signal of each of the comparators 104 is also coupled to a respective input of NOR gate 108. The purpose of NOR gate 108 is to produce a high logic level output signal for each of the words that are not being compared. Remember that each of AND-gates 106 generates a high logic level signal only when a word-match is detected at the proper location within the packet. That means that each of AND-gates 106 will generate an extraneous low logic level signal for all words that are not selected for comparison by having their word locations within the packet programmed into any of comparators 104. These extraneous low logic level signals must be masked to prevent them from being incorrectly interpreted as word mismatches detected at locations that were selected for comparison. NOR gate 108 provides this masking function by detecting those word locations for which no comparator 104 has been programmed and, in response to that detection, outputting a high logic level signal to OR gate 112. Thus, the PATTERN MATCH signal will continue to reflect "good matches" until and unless an actual word-mismatch is detected at a preprogrammed location within the packet. Conversely, NOR gate 108 will output a low signal to OR gate 112 (i.e., will return control of OR gate 112 to AND gates 106) if any one of the comparators 104 finds a match between the current clock cycle value and the preprogrammed clock cycle value.

Counter 120, illustratively a 12-bit counter, provides the output signal 128 that is coupled to a first input of each comparator 104. Counter 120 has a range at least equal to the number of bytes in the packet to be processed. Counter 120 receives clock input signal (CK) 122 at a clock input, "Data Valid" (VALID) input signal 124 at a count enable (CE) input and "Start of Packet" (SOP) input signal 126 at a reset input. The counter 120 increments its output count in response to the clock signal changing state coincident with a valid data indication. The counter 120 is reset to zero in response to the assertion of the SOP input signal (i.e., the start of a new multiple clock cycle packet). In this manner, the counter output is zeroed at the start of a newly received packet, and thereafter is incremented by one in response to the occurrence of a clock signal if the Data Valid signal is TRUE. Each count is therefore associated with a valid byte or word of received data, and the count indicates the offset byte or word number with respect to the start of the respective multiple clock cycle packet.

"Start of Packet" (SOP) input signal 126, "Data Valid" input signal 124 and an "end-of-packet" (EOP) input signal 160 are coupled to, respectively, first delay element 162, second delay element 164 and third delay element 166. Each of the three delay elements 162, 164 and 166 also receives the clock signal 122. First delay element 162 produces a delayed "Start of Packet" (SOP) signal, second delay element 164 produces a delayed "Data Valid" signal and third delay element 166 produces a delayed "end-of-packet" (EOP) signal. The delayed "end-of-packet" (EOP) signal forms a "Pattern Complete" indication.

Delay element 164 delays the Data Valid Input signal to match the time it takes from receiving the Data Valid Input signal 124 at counter 120 to when the selected compare and enable values are routed through the output of OR gate 112.

Multiplexer (MUX) 140 operates to couple one of the signals received at its inputs (A0, A1, B) to an output in response to control signals received at its "select A" or SA 150 and "select B" or SB 148 control inputs. In operation, the SB input 148 is given higher priority over the SA input 150. That is, if SB 148 is in a high state, MUX input "B" 146 is selected regardless of the state of input SA 150.

Each of the output signals produced by AND gates $106_1$ through $106_n$ and by NOR gate 108 is coupled to a respective input of OR gate 112. The output of OR gate 112 is coupled to each of inputs "A1" 144 and "B" 146 of multiplexer (MUX) 140. The delayed "Start of Packet" (SOP) signal produced by first delay element 162 is coupled to the "select B" input 148 of the MUX 140.

The output of the MUX 140 is coupled to a "D" input of flip-flop $156_1$. The output "Q" of flip-flop 156, provides a "Pattern Match" indication 172 which is coupled to the A0 input of MUX 140 and a first input of AND gate 154. A second input of AND gate 154 receives the delayed "Data Valid" signal from second delay element 164. MUX 140 is used in conjunction with first flip-flop 156, to perform a latching action The delayed "Data Valid" signal from second delay element 164 is coupled to a "D" input of flip-flop $156_2$. The output "Q" of flip-flop $156_2$ provides a "Pattern Active" indication 174. Flip-flops $156_1$ and $156_2$ are also clocked via the clock signal CK.

In the above embodiment of the invention, each of a plurality of word recognizers is used to recognize or determine whether a corresponding word is located within a respective portion of packetized data spanning multiple clock cycles. The portion is determined by the respective comparator reference count value which may be at any location within the packet. Each of the word recognizers supplies an output signal to a logic element indicative of its present word match status (i.e., "match present" or "no match present"). The comparators allow the OR gate to see only those matches associated with correct corresponding packetized data portions (i.e., time slots). If all time slots are associated with matches, then the desired pattern is present, and the "Pattern Match" indicator will reflect this.

In the above embodiment, the word recognizers 102 and comparators 104 are pre-programmed with, respectively, reference word and reference count (data packet offset count) values. In other embodiments, these parameters are user defined and may be programmed via control signals (not shown) from, for example, a controller associated with a test and measurement device including the invention.

Various embodiments of the Pattern Match circuit of the present invention allows a user to define the particular words (e.g., bit pattern or value) that must match, the quantity of words in a packet that must match, as well as the clock cycles in which such word matches are to occur, prior to enabling the downstream circuitry to initiate a trigger event. Once one or more data patterns have been identified, at least one true or false output signal may be sent to a trigger machine to define a trigger event.

The number of word recognizers 102 (and associated comparators 104) defines the maximum number of words that may be compared in a given packet at one time. That is, the number of word recognizers utilized in the Pattern Match circuit 100 reflects the number of bytes (words) that a circuit designer/user desires to perform comparison operations, regardless of where the bytes are located in the data stream. For example, if there are seven word recognizers 104 (n=7) coupled in parallel to the Data-In line input 110 of the Pattern Match circuit 100, then a user may program up to seven word recognizers to compare 7 bytes (words) of a packet (data stream).

The location of the particular word among a plurality of bytes in a packet to be examined is determined by setting the reference count of the respective comparators 104. For example, if a user is only interested in matching 4 bytes (words) in a packet, then the user will only program, illustratively, the first four WR's $102_1$ through $102_4$ and their respective comparators $104_1$ through $104_4$.

If the comparator reference value packet data/word (offset value) matches the counter value, the associated word recognizer is enabled. For example, assume that the user is interested in the $3^{rd}$, $6^{th}$, and $29^{th}$ words of a 55 word packet. Also assume the Data Valid Input signal 124 is high for each word in a sequence of words received from the Data-In line input 110. In this instance, only three comparators, such as the first three comparators, $104_1$ to $104_3$, word recognizers $102_1$ to $102_3$, and AND gates $106_1$ to $106_3$ are respectively required. That is, the first comparator $104_1$ is programmed to a value of 3 (e.g., binary or hex value), the second comparator $104_2$ is programmed to a value of 6, and the third comparator $104_3$ is programmed to a value of 29, thereby representing the $3^{rd}$, $6^{th}$ and $29^{th}$ bytes in the packet.

Once a SOP signal arrives, counter 120 is reset to zero, and begins counting each subsequent valid clock cycle, where a valid clock cycle indicates that the incoming data is associated with the current packet being examined. Since the Data Valid Input signal 124 is illustratively assumed to always be in a high condition, the output 128 of counter 120 increments at each sequential clock cycle. As such, each of the three comparators $104_1$ through $104_3$ performs a comparison of the current clock cycle to its respective preprogrammed clock cycle. During the first clock cycle, counter 120 increments by one to a value of "1", and the three comparators $104_1$ to $104_3$ check to see if they are programmed for the clock value of "1". From the example above, since none of the comparators 104 are illustratively programmed for the first clock cycle value, the comparators send a low signal to the input of its respective AND gate 106.

Similarly, the three comparators send a low signal to AND gates 106 during the second clock cycle. However, during the third clock cycle, counter 120 increments to a current clock value of "3" and first comparator $104_1$ finds a match. That is, first comparator $104_1$ has a preprogrammed value of "3", which matches the current clock value. Accordingly, first comparator $104_1$ sends a high signal to the input of the respective AND gate $106_1$. Further, the second and third comparators $104_2$ and $104_3$ send low signals to their respective AND gates $106_2$ and $106_3$, since they are programmed to other clock values (e.g., 6 and 29).

It is noted that if word recognizer $102_1$ finds a match during the third clock cycle, a high signal is also sent to AND gate $106_1$. AND gate $106_1$ sends a high output signal to OR gate 112, which consequently causes a high state Pattern Match output signal 172. However, if word recognizer $102_1$ does not find a match during the third clock cycle, a low signal is also sent to AND gate $106_1$. AND gate $106_1$ then sends a low output signal to OR gate 112. Consequently, the low signals from word recognizer $104_1$ and comparator $106_1$ cause MUX 140 to produce a low state Pattern Match output signal 172. The low state Pattern Match output signal 172 may be used by the downstream circuitry 190, in conjunction with the Pattern Active output 174, to define an occurrence of an event, such as to stop storing the incoming packet, among other events.

The output signal of each of the comparators 104 is also coupled to a respective input of NOR gate 108. As described above, the purpose of NOR gate 108 is to produce a high logic level output signal for each of the words that are not being compared. Remember that each of AND-gates 106 generates a high logic level signal only when a word-match is detected at the proper location within the packet. That means that each of AND-gates 106 will generate an extraneous low logic level signal for all words that are not selected for comparison by having their word locations within the packet programmed into any of comparators 104. These extraneous low logic level signals must be masked to prevent them from being incorrectly interpreted as word mismatches detected at locations that were selected for comparison. NOR gate 108 provides this masking function by detecting those word locations for which no comparator 106 has been programmed and, in response to that detection, outputting a high logic level signal to OR gate 112. Thus, the PATTERN MATCH signal will continue to reflect "good matches" until and unless an actual word-mismatch is detected at a preprogrammed location within the packet. Conversely, NOR gate 108 will output a low signal to OR gate 112 (i.e., will return control of OR gate 112 to AND gates 106) if any one of the comparators 104 finds a match between the current clock cycle value and the preprogrammed clock cycle value.

The present embodiment has been primarily described as enabling a single word recognizer 102 for a particular clock cycle. However, one skilled in the art will appreciate that the Pattern Match circuit 100 may be utilized to satisfy a logical OR condition, such that more than one WR 102 may be enabled during a particular clock cycle. For example, WR-1 and WR-2 may be programmed with different words, and the first and second comparators may be set to enable WR-1 and WR-2 on the third clock cycle. In such instance, if either one of the word recognizers WR-1 or WR-2 identifies a match, then a high output signal would be sent to its respective AND gate 106.

The downstream circuitry 190 (e.g., a trigger machine), which is not considered a part of the present invention, utilizes the three output signals (Pattern Match 172, Pattern Active 174, and Pattern Complete 176) to initiate a trigger event or refrain from changing the present state. For example, it may be deemed desirable to store packets having certain values (words) in the packet during predefined clock cycles. In an instance where the Pattern Match output 172 is high and the Pattern Active output 174 is also high, the downstream circuitry 190 will illustratively interpret the two output signals 172 and 174 from the Pattern Match circuit 100 to cause the storage of the particular packet.

FIG. 2 is a schematic diagram of a Pattern Match circuit 200 according to an alternate embodiment of the present invention. The Pattern Match circuit 200 of FIG. 2 differs from the first embodiment of FIG. 1 in that instead of having multiple word recognizers $102_1$ through $102_n$ (i.e., one word recognizer for each respective counter comparator 104), a single word recognizer 202 is utilized. In this embodiment, counter comparators 104 select a different compare and enable value for the single word recognizer 202, depending on the count value. Each of these counter comparators is capable of enabling the one word recognizer at the appropriate packet data offset count.

Specifically, the Pattern Match circuit 200 of FIG. 2 comprises a counter 120, a plurality of comparators 104, select logic 230, a plurality of enable value registers $212_1$ through $212_n$ (collectively enable value registers 212), a plurality of compare value registers $214_1$ through $214_n$ (collectively compare value registers 214), an enable values MUX $220_1$, a compare values MUX $220_2$, word recognizer 202, a word recognizer output MUX 140, an AND gate 154, a first and a second flip-flop $156_1$ and $156_2$, and three delay elements 162, 164, and 166.

The operations of the counter 120, multiplexer 140, AND gate 154, flip-flops 156 and delay elements 162-166 are substantially the same as previously described with respect to the Pattern Match circuit 100 of FIG. 1. As such, the operation of these elements will not be described again. One difference to note is that the signal received by the MUX 140 of FIG. 2 is produced by the word recognizer 202, while the signal received by the MUX 140 of FIG. 1 is provided by the OR gate 112.

It is noted that in the block diagram for the first Pattern Match circuit 100 of FIG. 1, the compare and enable registers for the word recognizers are not shown. The function they represent is assumed to be part of each word recognizer $102_1$ through $102_n$. By comparison, in this second circuit embodiment 200, the enable and compare values are respectively shown as registers 212 and 214 that are external to the single word recognizer 202. Further, an enable and compare register pair (212 and 214) are associated with each comparator 104 in the circuit. Accordingly, since there are n comparators 104 (where n is an integer greater than 1), the circuit 200 includes n enable value registers $212_n$ and n compare registers $214_n$. As such, enable and compare value register pairs $212_1$ and $214_1$ are associated with comparator $104_1$, enable and compare value register pairs $212_2$ and $214_2$ are associated with comparator $104_2$, and so forth.

Each enable value register $212_n$ has an output that is coupled to corresponding input terminals of the enable value MUX $220_1$, and similarly, each compare value register $214_n$ has an output that is coupled to an input of the compare value MUX $220_2$. Each register pair holds enable and compare values for word recognizer 202. By using the comparators 104 and Select Logic block 230, different enable and compare values are routed to the word recognizer 202 for different count values.

Each of the selectable enable value registers 212 are respectively coupled to corresponding inputs of enable values MUX $220_1$, which provides an output signal to the second input 206 of word recognizer 202. Similarly, compare value register 214 is respectively coupled to compare values MUX $220_2$, which provides an output signal to the third input 208 of word recognizer 202. Each of the MUXs 220 selects one of the buses to output to word recognizer 202. Since each bus is, illustratively, 8 bits wide, each MUX's output is, illustratively, 8 bits wide.

An output of each comparator 104 is coupled to a respective input 232 of select logic 230, while an output 234 of select logic 230 is coupled to an input select "S" of enable values MUX 220, as well as an input select "S" of compare values MUX $220_2$. The output 210 of word recognizer 202 is coupled to the A1 input 144 and B input 146 of output MUX 140. The remaining circuitry of the Pattern Match circuit 200 of FIG. 2 is the same as the first embodiment of circuit 100 of FIG. 1.

Each comparator 104 is programmed with an offset value (clock cycle value) where word recognizer 202 needs to compare the incoming data. A comparator 104 will output a true when the count value in a comparator matches the offset value. The number of comparators needed is determined by how many bytes in a packet stream from Data-In line input 110 are to be examined. It is noted that the output of the comparators 104 is used differently than the first Pattern Match circuit 100 of FIG. 1.

When a comparator is true, it's associated enable and compare register pair needs to be selected by the MUXs 220. Select Logic block 230 includes decoding logic that drives the appropriate value onto the MUX Select lines 234 to select the proper enable and compare register pair. If none of the comparators 104 are true (none of them matched the counter value), the MUX Selects of each MUX 220 are set such that the Enable MUX 220, will produce an output having all low bits. This low signal will cause word recognizer 202 to treat the incoming data as a "don't care" condition. The output 210 of word recognizer 202 remains high when a "don't care" condition occurs.

The enable and compare MUXs 220 and Data-In line input (serial data) 110 drive word recognizer 202. By changing the enable and compare values depending on the count, only one word recognizer 202 is needed. The same number of enable and compare registers 212 and 214 (i.e., pairs) are needed in both embodiments of FIGS. 1 and 2. However, the multiple word recognizers 102, AND gates 106, and OR gate 112 may be replaced with a single word recognizer 202, Select Logic block 230, and enable and compare MUXs 212 and 214. For any given count value, word recognizer 202 will use the enable and compare value to compare against the incoming data from Data-In line input 110. The output of word recognizer 202 is the same as the output of OR gate 112 in the first implementation of FIG. 1.

In a first mode of operation of the Pattern Match circuit 200, the SOP signal 126 is true, and the SOP signal is delayed so that it matches the time it takes the signal from Data-In line input 110 to propagate through to the output of word recognizer 202. The delayed SOP signal drives the SB select input 148 of MUX 140, which will cause MUX 140 to select input B 146. Input B 146 is driven by word recognizer 202. So the output 210 of word recognizer 202 becomes the output Pattern Match 172.

In a second mode of operation of the Pattern Match circuit 200, SOP 126 is not true, Pattern Match 172 is true, and the valid signal 124 is true. For this clock, the output of word recognizer 202 is the compare results on data that is not the first byte of the pattern. Since Pattern Match 172 is true (no word recognizer mismatches have occurred yet) and Data Valid Input signal 124 is true, the SA select input 150 of MUX 140 is high, while the SB select input 148 is low. MUX 140 selects input A1 144, and the output 210 of word recognizer 202 again becomes the output Pattern Match 172.

In a third mode of operation of the Pattern Match circuit 200, SOP 126 is false, Pattern Match 172 is true, and Data Valid Input signal 124 is false. For this clock cycle 122, there was no valid data to be compared. Select input SB 148 and select input SA 150 of MUX 140 are both low, which causes MUX 140 to select input A0 142. The A0 input 142 is driven by the Pattern Match output 172 via feedback loop 141, so with no Data Valid Input signal 124, the Pattern Match output 172 remains unchanged.

In a fourth mode of operation of the Pattern Match circuit 200, SOP 126 is false, Pattern Match 172 is false, and Data Valid Input signal 124 is true. If Pattern Match 172 ever goes false, the Data Valid Input signal 124 is prevented from driving the MUX select input SA 150. That is, the SA select input 150 will be held low. As long as MUX select input SB 148 remains low, MUX input A0 142 is selected. Since the Pattern Match output 172 is low and fed back (via feedback loop 141) to the A0 input 142, the Pattern Match output 172 remains low. It is noted that the Pattern Match output 172 will remain low until an SOP 126 occurs, which causes the SB select input 148 to go high.

Figure 3:
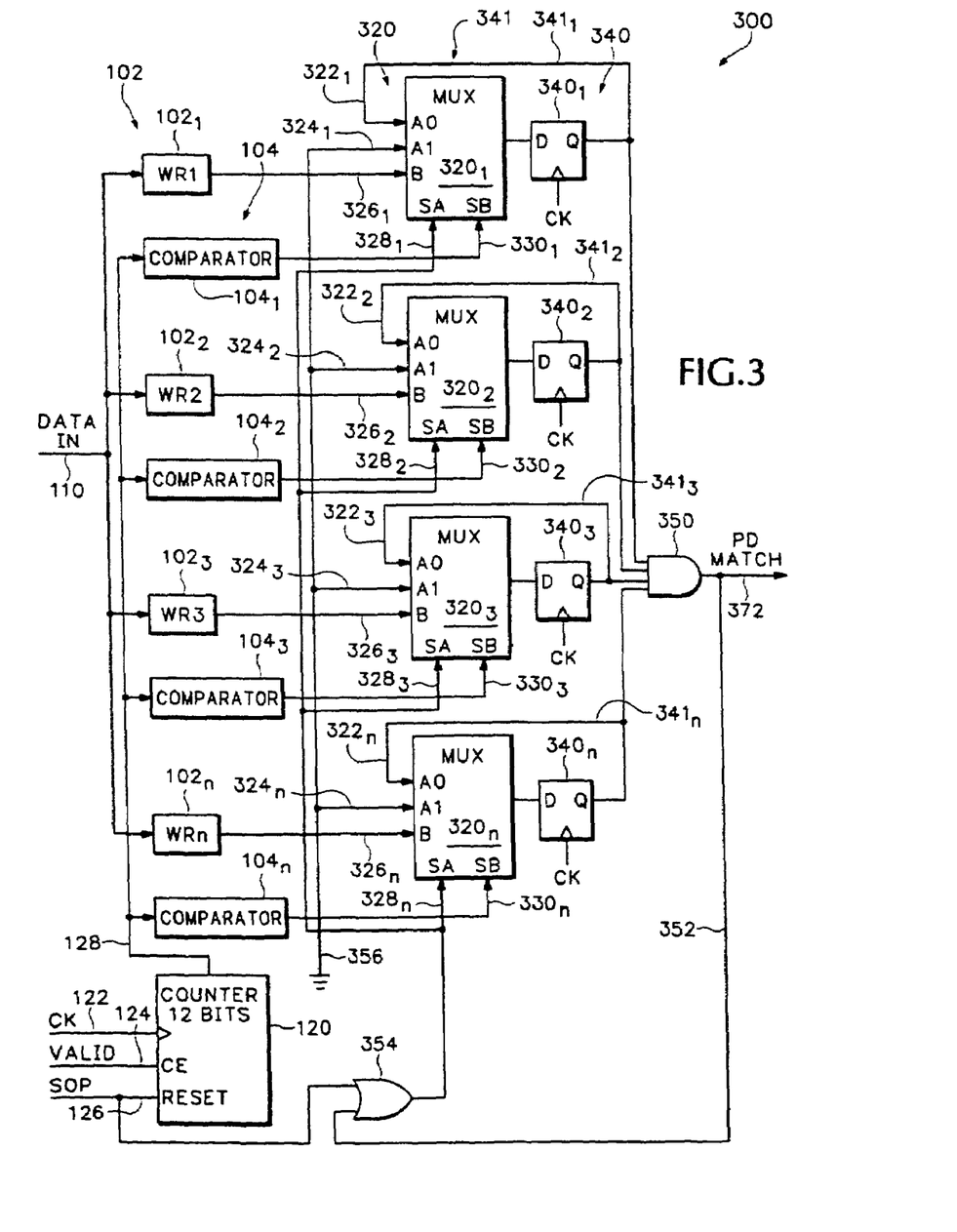
FIG. 3 is a schematic diagram of a Pattern Match circuit according to an embodiment of the present invention.

FIG. 3 is a schematic diagram of a Pattern Match circuit 300 according to an embodiment of the present invention. Pattern Match circuit 300 utilizes four input signals and a single Pattern Match output, where the Pattern Match output will go high for one clock cycle when the specified pattern has been found.

Pattern Match circuit 300 comprises a counter 120, a plurality of word recognizers $102_1$ through $102_n$ (collectively word recognizers 102), a plurality of comparators $104_1$ through $104_n$ (collectively comparators 104), a plurality of multiplexers (MUXs) $320_1$ through $320_n$ (collectively MUXs 320), a plurality of flip-flops $340_1$ through $340_n$ (collectively flip flops 340), an OR gate 354, and an AND gate 350.

Only differences between the embodiments to FIG. 3 and those of FIG. 1 will be described in detail herein. Specifically, the operation of the word recognizers 102, comparators 104 and counter 120 in both embodiments are substantially the same.

In contrast to the five input signals previously used, the Pattern Match circuit 300 of FIG. 3 does not use an EOP input signal and produces only a Pattern Match output signal. The produced Pattern Match output signal remains low unless every word recognizer finds a specified match, at which time it is set high for one clock cycle (i.e., a pulse), as discussed below in further detail.

Referring to FIG. 3, the output of each word recognizer 102 is coupled to an associated MUX 320. Specifically, the output of word recognizer $1O2_1$ is coupled in parallel to input "B" $326_2$ of multiplexer $320_2$, and so forth. The input "A1" (324) of each multiplexer 320 is connected to ground 356.

Similar to FIG. 1, an output of each MUX 320 is coupled to a first input (e.g., "D" input) of a respective flip-flop 340. Further, clock signal 122 is also coupled to a second input of each flip-flop 340. An output (e.g., "Q" output) signal of each flip-flop 340 is coupled to an "A0" input 322 of its respective MUX 320 via feedback loop 341. For example, an output of MUX $320_1$ is coupled to a D-input of flip-flop $340_1$, and Q-output of flip-flop $340_1$ is coupled to A0 input $322_1$ of MUX $320_1$ via feedback loop $341_1$. Similarly, an output of MUX $320_2$ is coupled to a D-input of flip-flop $340_2$, and Q-output of flip-flop $340_2$ is coupled to A0 input $322_2$ of MUX $320_2$ via feedback loop $341_2$, and so forth.

Each comparator 104 has an output coupled to a select "B" (SB) input 330 of a respective MUX 320. For example, comparator $104_1$ is coupled to SB input $330_1$ of MUX $320_1$, comparator $104_2$ is coupled to SB input $330_2$ of MUX $320_2$, and so forth.

The output of each flip-flop 340 is coupled to a respective input of AND gate 350. A single output of AND gate 350 defines the Pattern Match output signal 372. The Pattern Match output signal 372 is fed back via feedback loop 352 to a first input of OR gate 354. The SOP signal 126 is coupled to a second input of OR gate 354. An output of OR gate 354 is coupled to an SA input of each MUX 320.

The Pattern Match output 372 stays in a low state, except when all of the inputs of AND gate 350 are in a high state. The high Pattern Match output 372 is fed back to OR gate 354 via feedback loop 352, where the output of OR gate 354 is utilized to reset the latched MUXs 320 on the next clock cycle. Thus, if each of the word recognizers identifies a match during its associated predefined clock cycles for a particular packet, a high Pattern Match output 372 will occur for a single clock cycle after the final word match is identified.

For example, assume a user wants to find a Pattern Match for incoming bytes (words) that occur on the first, third, fifth, and seventh clock cycles. Comparators $104_1$ through $104_n$ (where n illustratively equals four) are respectively programmed to provide a high output signal on the first, third, fifth, and seventh clock cycles.

At the first clock cycle, an SOP signal is received by counter 120, and word recognizer $102_1$ and comparator $104_1$ are enabled. The input SB $330_1$ of MUX $320_1$ is driven high. The other word recognizers $102_{2-n}$ and comparators $104_{2-n}$ are disabled (i.e., input SA $328_{2-n}$ of MUXs $320_{2-n}$ are low). In other words, the output of the associated word recognizer 102 is latched by the associated MUX 320 when its respective count comparator 104 is in a high state.

When the output of comparator $104_1$ is high, the output of word recognizer $102_1$ is sent to input B $326_1$ of MUX $320_1$. If the word recognizer $102_1$ is high (i.e., a match), MUX $320_1$ produces a high output, which is sent to the input of flip-flop $340_1$. Flip-flop $340_1$ latches in a high state and sends a high output signal to a first input of AND gate 350. It is noted that if the word recognizer $102_1$ is low (i.e., word mismatch), MUX $320_1$ produces a low output, which is sent to the input of flip-flop $340_1$. Flip-flop $340_1$ then sends a low output signal to a first input of AND gate 350, which maintains the Pattern Match output 372 in a low state.

During the first clock cycle, the SOP signal 126 is coupled to input SA 328 of all the MUXs 320. For any of the MUXs 320 whose respective comparators 104 outputs are low, an input "A1" 324 of the respective MUX 320 is selected, which is tied low to ground 356. This will ensure that the outputs of the respective flip-flops 340 are also low, which is the default low state. Accordingly, where a word match occurs at the first word recognizer $102_1$ during the first clock cycle, the four inputs of AND gate 350 are "1000", which produces a low Pattern Match output 372. The low Pattern Match output signal 372 is fed back to the first input of OR gate 354. Since the second input of OR gate 354 is low (i.e., the first clock cycle is after the SOP signal), the output of OR gate 354 is low, which does not reset the MUXs 320.

During the second clock cycle, there is no SOP signal receive by counter 120. The output of comparators 104 is low, since none of them have been programmed to initiate a high select signal to their respective MUXs during the second clock cycle. Thus, each MUX selects input A0 322, and consequently the four inputs to AND gate 350 remain the same (i.e., 1000) and the Pattern Match output 372 remains low.

At the third clock cycle, the second comparator $104_2$ is enabled, and the input SB $330_2$ of MUX $320_2$ is driven high. MUX $320_2$ selects input B $326_2$, and if a word Pattern Match exists at the second word recognizer $102_2$, a high output from word recognizer $102_2$ is sent to the B input $326_2$ of MUX $320_2$. The output of MUX $320_2$ goes high and drives the input of flip-flop $340_2$ high, such that flip-flop $340_2$ sends a high output signal to the second input of AND gate 350. Since the other comparators $104_1$, $104_3$, and $104_n$ are not programmed to be enabled during the third clock cycle, the respective MUXs $320_1$, $320_3$, and $320_n$ select their respective inputs A0 322, such that the outputs from their respective flip-flops 340 remain the same. Therefore, the four inputs of AND gate 350 during the third clock cycle is "1100", which again produces a low Pattern Match output 372.

The Pattern Match circuit 300 continues in a similar manner for each sequential clock cycle during the exemplary fourth through sixth clock cycles. During the exemplary seventh clock cycle, the fourth comparator $104_n$ is enabled, and MUX $320_n$ selects input B $326_n$. If the incoming data word matches in word recognizer $102_n$, then the output of MUX $320_n$ to fourth flip flop $340_n$ is high, which drives a high output signal to the fourth input of AND gate 350. It is noted that the other MUXs 320 in Pattern Match circuit 300 select input A0, such that the latched high state from the respective flip-flops 340 is sent to AND gate 350. Thus, during the exemplary seventh clock cycle, the four flip-flops 340 will provide high output signals ("1111") to the four inputs of AND gate 350.

The high Pattern Match output 372 is fed back to OR gate 354 via feedback loop 352, and the output of OR gate 354 drives each SA input 328 of the MUXs 320 high. On the next clock cycle none of the comparators 104 will be true, since the counter 120 has incremented past where any of the offsets had been programmed into the comparators. With input SA hi and SB low, input A1 324 is selected. This will cause all of the flip-flops 340 to go low, which causes the Pattern Match output 372 to go low. Therefore, the high state Pattern Match output signal 372 will have occurred only during the exemplary seventh clock cycle of the incoming packet. Thus, all of the matches must occur within the same packet.

It is noted that the Pattern Match output 372 is fed back to the select input SA 328 of each MUX 320 to reset the latched outputs. Additionally, when a new SOP input signal 126 is received at counter 120 and OR gate 354, all of the latched word recognizer outputs will be cleared from MUXs 320, unless its respective comparator is true.

Specifically, when a comparator is programmed to examine the data when a SOP occurs (i.e., the first byte), then the output of the respective word recognizer will determine the new latched value. That is, select input SB (output of a comparator) has higher priority over SA. Therefore, if a comparator is programmed at a SOP signal, the output of the associated flip-flop 340 and MUX 320 are not reset. Since the comparator enables its associated word recognizer 102, the output of the word recognizer determines the new latched value.

Various embodiments of the invention have been shown and discussed above. These embodiments allow downstream circuitry 190 to track incoming data (i.e., a packet), across multiple clock cycles. It is noted that the present invention is well adapted to identify matches associated with non-initial words within the packetized data and/or a non-contiguous words within the packetized data. Furthermore, the embodiments produce either a single indicator or multiple true or false indicators to allow downstream circuitry (e.g., a trigger machine) to define a trigger event. The present invention provides a more straight forward method of defining a trigger event with packet style data, where the entire packet does not have to be examined.

Figure 4:
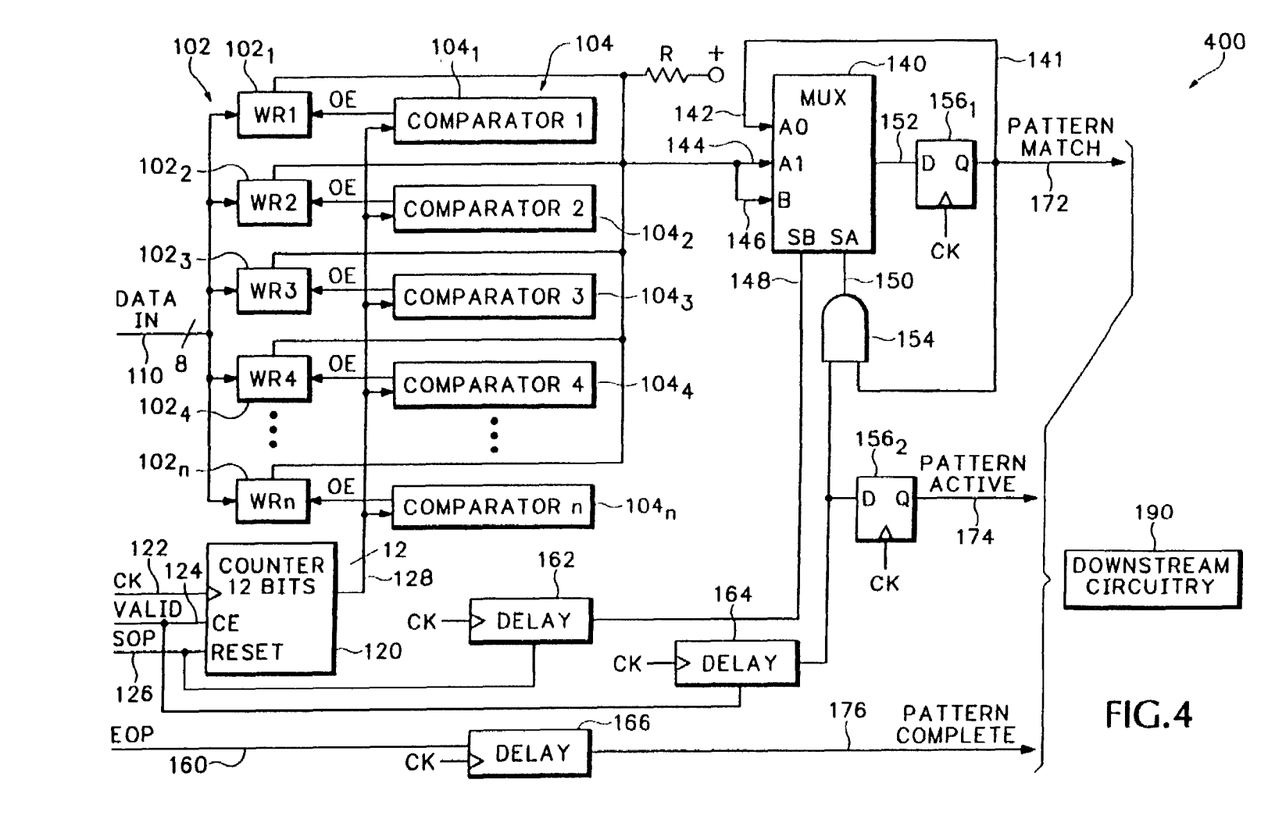
FIG. 4 depicts a schematic diagram of a Pattern Match circuit according to another embodiment of the present invention.

One skilled in the art will note that the circuitry of FIG. 1 can be simplified by the use of word recognizers 102 having a three-state output under control of an Output Enable signal. Such an arrangement is shown in FIG. 4. FIG. 4 includes all of the elements of FIG. 1 except for AND-gates 106, NOR-gate 108, and OR-gate 112. Each of word recognizers 102 of FIG. 4 has an Output Enable (OE) control terminal for receiving an Output Enable signal. The output signal of each corresponding count comparator 104 is coupled to a respective word recognizer 102, and serves as this Output Enable signal. The output terminals of word recognizers 102 are wired-ORed by being connected to a common pull-up resistor R, and to input terminals A1 and B of Multiplexer 140. When a comparator 104 detects that the current clock count value equals its preprogrammed count value, that comparator enables the output of its associated word recognizer 102. A mismatch at that word recognizer 102 will produce a low logic level signal at input terminals A1 and B of Multiplexer 140. Conversely, a match at that word recognizer 102 will produce a high logic level signal at input terminals A1 and B of Multiplexer 140. When no comparator 104 detects that the current clock count value equals its preprogrammed count value, then no output of any word recognizer 102 will be enabled, and pull-up resistor R will supply a high logic level signal to input terminals A1 and B of Multiplexer 140, thus providing a high logic level signal for words at all locations that were not programmed to be compared. All other circuitry of FIG. 4 operates in substantially the same way as was described above with respect to FIG. 1, and need not be described again.

Although various AND and OR logic gates/operators have been shown and discussed in the various embodiments of the present invention, a person skilled in the art will appreciate that other logical operators/devices, or combinations thereof, may also be implemented in the present invention. For example, the D-Q flip-flops illustratively shown in FIGS. 1, 2, 3, and 4 are not to be considered as being limiting, and other types of flip-flops and logical operators may alternatively be used in the embodiments of the Pattern Match circuit of the present invention.

It will be appreciated by those skilled in the art that the above-described systems, apparatus and circuitry may be alternatively implemented using hardware, software or a combination of hardware and software. Thus, while primarily described in terms of apparatus, the invention may also be implemented as a plurality of processes in which a method for processing packetized data spanning multiple clock cycles is provided to achieve, for example, the above described pattern recognition function.

While the foregoing is directed to illustrative embodiments of the present invention, other and further embodiments of the invention may be devised without departing from the basic scope thereof, and the scope thereof is determined by the claims that follow.

The invention claimed is:

1. Apparatus for processing packetized data spanning multiple clock cycles, comprising:
   a counter for counting cycles of a clock signal, said counter being responsive to said clock signal, to a Data Valid signal indicative of the presence of valid data, and to an SOP signal indicative of a start of a packet, said counter incrementing its clock cycle count in response to each of said clock cycles when said Data Valid signal is present, said counter having a range of counts at least equal to a length of said packet;
   a first comparator, for comparing a present clock cycle count to one of a plurality of reference clock cycle count values and producing a first enable signal in response to a favorable determination, said favorable determination being a determination that said present clock cycle count is equal to said reference clock cycle count value of said first comparator, and wherein each of said reference clock cycle count values can be equal to any count value within said range of counts of said counter;
   a second comparator, for comparing said clock cycle count to one of a plurality of reference clock cycle count values and producing a second enable signal in response to a favorable determination, said favorable determination being a determination that said present clock cycle count is equal to said reference clock cycle count value of said second comparator, and wherein each of said reference clock cycle count values can be equal to any count value within said range of counts of said counter;
   a first word recognizer, for comparing a presently received digital word to a reference digital word and producing a determination of equality or non-equality in response to said first enable signal;
   a second word recognizer, for comparing a presently received digital word to a reference digital word and producing a determination of equality or non-equality in response to said second enable signal; and
   an output circuit for providing an indication of whether said digital word comparisons produced a determination of equality at each clock cycle corresponding to a reference clock cycle count value.

2. The apparatus of claim 1, wherein:
   said apparatus includes more than two comparators and said reference clock cycle count value of said first comparator is non-contiguous with said reference clock cycle count value of any other of said comparators.

3. The apparatus of claim 1, wherein said reference clock cycle count value of said first and second comparators is the same value.

4. The apparatus of claim 1, wherein said output circuit comprises:
   a multiplexer coupled to receive said output determination signals of said first and second word recognizers; and
   a latch coupled to said multiplexer for storing the determination signal.

5. The apparatus of claim 1, wherein said word recognizers are capable of enabling individual bits of said digital words for comparison, and at least one bit of said presently received digital word and said reference digital word is enabled for comparison.

6. The apparatus of claim 1, wherein said indication of favorable digital word comparisons remains False unless said digital word comparisons produced a determination of equality at all clock cycles corresponding to a reference clock cycle count value.

7. The apparatus of claim 1, wherein said indication of favorable digital word comparisons remains TRUE unless said digital word comparisons produced a determination of non-equality at any of said clock cycles corresponding to a reference clock cycle count value.

8. Apparatus for processing packetized data spanning multiple clock cycles, comprising:
   a counter for counting cycles of a clock signal, said counter being responsive to said clock signal, to a Data Valid signal indicative of the presence of valid data, and to an SOP signal indicative of a start of a packet, said counter incrementing its clock cycle count in response to each of said clock cycles when said Data Valid signal is present, said counter having a range of counts equal to a length of said packet;

a first comparator, for comparing a present clock cycle count to one of a plurality of reference clock cycle count values and producing a first enable signal in response to a favorable determination, said favorable determination being a determination that said present clock cycle count is equal to said reference clock cycle count value of said first comparator, and wherein each of said reference clock cycle count values can be equal to any count value within said range of counts of said counter;

a second comparator, for comparing said clock cycle count to one of a plurality of reference clock cycle count values and producing a second enable signal in response to a favorable determination, said favorable determination being a determination that said present clock cycle count is equal to said reference clock cycle count value of said second comparator, and wherein each of said reference clock cycle count values can be equal to any count value within said range of counts of said counter;

a word recognizer, for comparing a presently received digital word to a reference digital word and producing a determination of equality or non-equality in response to said first enable signal, thereafter said word recognizer being programmed with a second reference digital word for comparing a further received digital word to said second reference digital word and producing a determination of equality or non-equality in response to said second enable signal; and an output circuit for providing an indication of whether said digital word comparisons produced a determination of equality at each clock cycle corresponding to a reference clock cycle count value.

9. The apparatus of claim 8, further comprising:
a plurality of enable value registers and a respective plurality of compare value registers each having an output coupled to said word recognizer;
each of said comparators respectively associated with an enable value register and a compare value register;
a select logic device for enabling transfer of respective enable and compare values to said word recognizer in response to said comparator having produced said favorable determination.

10. The apparatus of claim 8, wherein said word recognizers are capable of enabling individual bits of said digital words for comparison, and at least one bit of said presently received digital word and said reference digital word is enabled for comparison.

11. The apparatus of claim 9, wherein:
said plurality of compare value registers each provides a predetermined compare reference digital word value; and
said plurality of enable value registers respectively specify said individual bits used to perform comparisons to said reference digital word values, said enabled digital bits forming predetermined data channels.

12. The apparatus of claim 8, wherein:
said output circuit comprises a multiplexer coupled to receive said output determination signals of said first and second word recognizers; and
a latch coupled to said multiplexer for storing the determination signal.

13. The apparatus of claim 8, wherein said indication of favorable digital word comparisons remains FALSE unless said digital word comparisons produced a determination of equality at all clock cycles corresponding to a reference clock cycle count value in which case said indication becomes TRUE.

14. The apparatus of claim 8, wherein said indication of favorable digital word comparisons remains TRUE unless said digital word comparisons produced a determination of non-equality at any of said clock cycles corresponding to a reference clock cycle count value.

15. The apparatus of claim 13 wherein said apparatus is a logic analyzer and said logic analyzer is triggered upon detection of said TRUE indication.

16. The apparatus of claim 14 wherein said apparatus is a logic analyzer and said logic analyzer is triggered when said indication is TRUE upon detection of an End of Packet signal.

17. Method for processing packetized data spanning multiple clock cycles, comprising:
counting cycles of a clock in a counter, said counter counting from a start of packet (SOP) signal only in response to a Data Valid signal indicative of the presence of valid data, said counter having a range equal to a length of a packet;
comparing, at each of a plurality of comparators, a present clock cycle count from the counter to a reference clock cycle value and producing a respective enable signal at each of said comparators in response to a determination that said present cycle count equals its respective reference clock cycle value;
enabling at least one word recognizer of a respective plurality of word recognizers in response to said respective enable signal;
comparing, at at least one word recognizer, a presently received digital word from the packetized data to a reference digital word;
providing, at an output of an enabled word recognizer, an indication of a favorable word comparison; and
providing, at an output, a TRUE indication when said digital word comparisons produced a determination of equality at each clock cycle count from the counter corresponding to the reference clock cycle count value.

18. The method of claim 17, further comprising setting each of said plurality of comparators with a different predetermined reference clock cycle count value.

19. The method of claim 17, further comprising setting at least two of said plurality of comparators with the same predetermined reference clock cycle count value.

20. The method of claim 17 further comprising triggering a logic analyzer in response to said TRUE indication.

* * * * *